US012622040B2

(12) United States Patent
Chiacchio et al.

(10) Patent No.: US 12,622,040 B2
(45) Date of Patent: May 5, 2026

(54) DIODE WITH CONTACT STRUCTURE INCLUDING AN IMPROVED BARRIER REGION AND RELATED MANUFACTURING PROCESS

(71) Applicant: STMICROELECTRONICS S.r.l., Agrate Brianza (IT)

(72) Inventors: Ettore Chiacchio, Catania (IT); Ignazio Bertuglia, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 558 days.

(21) Appl. No.: 18/150,118

(22) Filed: Jan. 4, 2023

(65) Prior Publication Data
US 2023/0223458 A1 Jul. 13, 2023

(30) Foreign Application Priority Data
Jan. 10, 2022 (IT) ........................ 102022000000203

(51) Int. Cl.
*H10D 64/64* (2025.01)
*H01L 21/285* (2006.01)
(Continued)

(52) U.S. Cl.
CPC ....... *H10D 64/64* (2025.01); *H01L 21/28537* (2013.01); *H10D 8/051* (2025.01); *H10D 8/60* (2025.01); *H10D 62/107* (2025.01)

(58) Field of Classification Search
CPC .......... H10D 64/64; H10D 8/051; H10D 8/60; H10D 62/107; H10D 8/411; H10D 8/043;
(Continued)

(56) References Cited

U.S. PATENT DOCUMENTS 10,658,467 B2 * 5/2020 Hori ..................... H10D 62/106
11,309,438 B2 * 4/2022 Ohse ........................ H10D 8/60
(Continued)

FOREIGN PATENT DOCUMENTS

CN 1841678 A 10/2006
CN 113451298 A 9/2021
(Continued)

OTHER PUBLICATIONS

Broadbent et al., "Self-Aligned Silicided (PtSi and CoSi2) Ultra-Shallow p+ /n Junctions," *IEEE Electron Device Letters* 8(7), Jul. 1987 (5 pages).
(Continued)

*Primary Examiner* — Shahed Ahmed
*Assistant Examiner* — Khatib A Rahman
(74) *Attorney, Agent, or Firm* — Seed Intellectual Property Law Group LLP

(57) ABSTRACT

The present disclosure is directed to a diode with a semiconductor body of silicon including a cathode region, which has a first conductivity type and is delimited by a front surface; and an anode region, which has a second conductivity type and extends into the cathode region from the front surface. The diode further includes a barrier region of cobalt disilicide, arranged on the anode region; and a metallization region of aluminum or of an aluminum alloy, arranged on the barrier region. The barrier region contacts the anode region.

13 Claims, 26 Drawing Sheets

(51) Int. Cl.
    *H10D 8/01*        (2025.01)
    *H10D 8/60*        (2025.01)
    *H10D 62/10*       (2025.01)

(58) Field of Classification Search
    CPC .. H10D 64/111; H10D 62/106; H10D 62/128;
            H10D 62/13; H10D 62/83; H10D 64/62;
                                        H01L 21/28537
    See application file for complete search history.

(56)                    References Cited

U.S. PATENT DOCUMENTS

| | | | | |
|---|---|---|---|---|
| 11,502,205 | B2 * | 11/2022 | Hori | H10D 8/50 |
| 11,527,634 | B2 * | 12/2022 | Ohse | H10D 84/146 |
| 2005/0026379 | A1 | 2/2005 | Kammler et al. | |
| 2015/0115449 | A1 | 4/2015 | Schaffer et al. | |
| 2015/0303268 | A1 * | 10/2015 | Ishimaru | H10D 62/112 |
| | | | | 257/608 |
| 2017/0186847 | A1 * | 6/2017 | Hikasa | H10D 64/23 |
| 2021/0226031 | A1 * | 7/2021 | Kojima | H10D 64/62 |

FOREIGN PATENT DOCUMENTS

| | | | |
|---|---|---|---|
| CN | 220189657 | U | 12/2023 |
| EP | 2341528 | A1 | 7/2011 |
| EP | 3196943 | A1 | 7/2017 |
| WO | 2014202750 | A1 | 12/2014 |

OTHER PUBLICATIONS

Thijs et al., "Impact of Elevated Source Drain Architecture on ESD Protection Devices for a 90nm CMOS Technology Node," *2003 Electrical Overstress/Electrostatic Discharge Symposium*, Las Vegas, NV, USA, Sep. 21-25, 2003, 11 pages.

Zhang et al., "Self-aligned silicides for Ohmic contacts in complementary metal-oxide-semiconductor technology: TiSi2, CoSi2, and NiSi," *Journal of Vacuum Science & Technology A Vacuum Surfaces and Films* 22(4), Jul./Aug. 2004 (12 pages).

* cited by examiner

DIODE WITH CONTACT STRUCTURE INCLUDING AN IMPROVED BARRIER REGION AND RELATED MANUFACTURING PROCESS

BACKGROUND

Technical Field

The present disclosure relates to a diode with a contact structure including an improved barrier region and to the related manufacturing process.

Description of the Related Art

As is known, in the field of semiconductor device manufacturing, the coupling between a semiconductor device and the outside world is made possible by contact structures that include metal regions (also known as metallizations), which are often formed by aluminum and are arranged in contact with the underlying semiconductor material (in particular, silicon).

Since aluminum tends to diffuse into silicon (a phenomenon also known as "interdiffusion"), with consequent diffusion in underneath doped regions and shortening with the deeper doped areas of the silicon, appropriate precautions should be taken to prevent this from happening.

For example, it is known that the aforementioned problem is overcome by adding a certain amount of silicon (for example, with a concentration typically comprised in the range 0.8-2%) in the aluminum region, to reduce the solubility of aluminum in the underlying semiconductor material; however, the material thus formed is characterized by high resistivity and has a relatively complicated manufacturing flow. For this reason, solutions have been proposed over time that provide for the use of one or more barrier layers formed by metal materials other than aluminum, such as titanium and related alloys, which guarantee the formation of good contacts on the semiconductor material and have a reduced solubility compared to aluminum. The barrier layers are interposed between the semiconductor material and the aluminum region.

In general, metal-semiconductor junctions based on one or more layers of titanium and/or related alloys prove to be satisfactory for contacting N-type or P-type semiconductor regions, provided that the doping is sufficiently high (approximately, higher than $1*10^{16}$ cm$^{-3}$); conversely, the junction exhibits a non-ohmic, i.e., rectifying, behavior.

The aforementioned rectifying behavior is particularly evident in case of so-called low efficiency injection anode diode, which are characterized by the presence of an anode region with P-type doping and low doping level (for example, with peak comprised between $1*10^{14}$ cm$^{-3}$ and $1*10^{16}$ cm$^{-3}$). In this case, the anode region has a reduced doping to increase the switching speed of the diode, although this involves an increase in the voltage drop in conduction regime, i.e., an increase in the so-called forward voltage, with the same current flowing through the diode.

A partial solution to the aforementioned problem of rectifying contacts in case of P-type semiconductive regions with low doping level is to adopt a barrier layer formed by platinum silicide, so as to benefit from the fact that platinum silicide has a lower Schottky barrier potential height than silicon with P-type doping. Unfortunately, however, platinum silicide has a negative forward voltage drop temperature coefficient at high current levels; this causes, in high power applications with multiple diodes connected in parallel, an irreversible imbalance effect, wherein the diode having the lowest voltage drop at the ends thereof draws the largest part of the load current, up to reaching the thermal runaway condition and the consequent destruction of the electronic component. Furthermore, this imbalance effect becomes even more critical as the junction temperature increases, since the average lifetime of the minority carriers induced by platinum has a positive temperature coefficient which contributes to further lower the voltage drop of diodes in conduction.

US 2017/0186847 A1 discloses a diode according to the preamble of claim 1. The paper "*Impact of Elevated Source Drain Architecture on ESD Protection Devices for a 90 nm CMOS Technology Node*", of Thijs S. et al., ELECTRICAL OVERSTRESS/ELECTROSTATIC DISCHARGE SYMPOSIUM, 2003, EOS/ESD '03, IEEE, Piscataway, NY, USA, 21 Sep. 2003, pp. 1-8, discloses a diode with a metallization of copper arranged on a barrier region.

BRIEF SUMMARY

Various embodiments of the present disclosure provide a diode that at least partially overcomes the drawbacks of the prior art, and methods of fabricating the same.

The diode includes a semiconductor body having a cathode region, which has a first conductivity type and is delimited by a front surface; and an anode region, which has a second conductivity type and extends into the cathode region from the front surface. The diode further includes a barrier region of cobalt disilicide, arranged on the anode region; and a metallization region of aluminum or of an aluminum alloy, arranged on the barrier region.

BRIEF DESCRIPTION OF THE SEVERAL VIEWS OF THE DRAWINGS

For a better understanding of the present disclosure, embodiments thereof are now described, purely by way of non-limiting example and with reference to the attached drawings, wherein.

DETAILED DESCRIPTION

Figure 1:
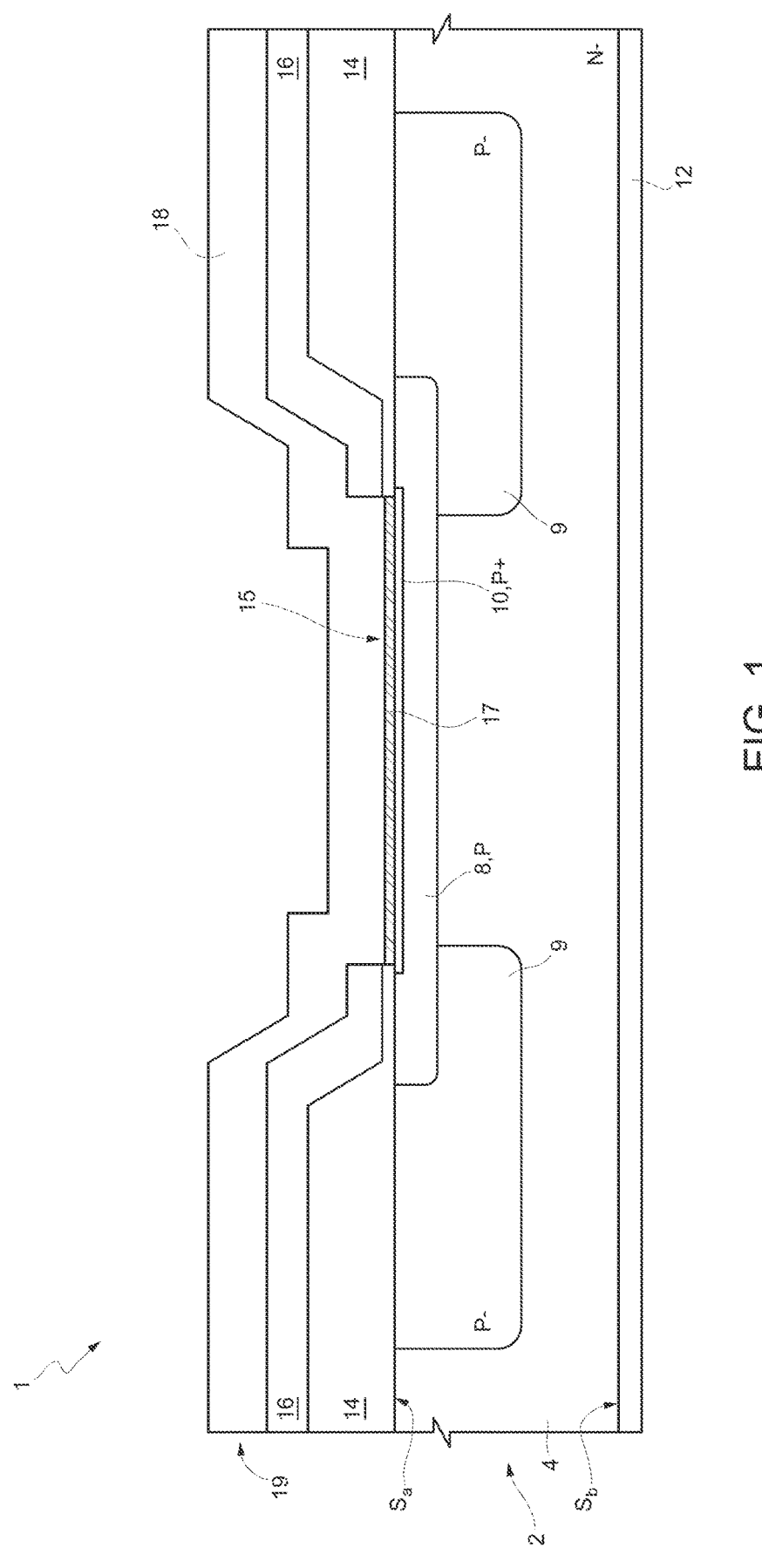
FIGS. 1, 2, 24, 25, and 26 schematically show cross-sections (not to scale) of embodiments of the present diode.

FIG. 1 shows a diode 1, which comprises a semiconductor body or substrate 2 formed by silicon, which in turn includes a cathode region 4, which has an N-type doping and is delimited by a front surface S$_a$ and by a rear surface Sb of the semiconductor body 2. As an example, the cathode region 4 has a N$^-$ peak doping level comprised between $10^{13}$ cm$^{-3}$ and $10^{14}$ cm$^{-3}$.

The semiconductor body 2 further comprises an anode region 8, which has P-type doping and extends into the cathode region 4, from the front surface S$_a$, so as to form a PN junction with the cathode region 4. The anode region 8 has a peak doping level for example comprised between $1*10^{14}$ cm$^{-3}$ and $1*10^{16}$ cm$^{-3}$. In a top view the anode region 8 may have approximately a circular or polygonal shape.

The semiconductor body 2 may further comprise a guard ring 9 (optional), which extends into the cathode region 4 from the front surface S$_a$, so as to laterally surround the anode region 8, wherewith it is in direct contact. The guard ring 9 has a doping of the P-type, i.e., it has a lower doping level than the doping level of the anode region 8. Furthermore, the guard ring 9 is for preventing the so-called edge breakdown of the anode region 8.

The semiconductor body 2 may further comprise an optional enriched anode region 10 (optional), which has a doping of the P+ type (for example, with peak doping level in the order of $1*10^{20}$ cm$^{-3}$) and is for obtaining a different trade-off between switching losses and conduction losses. The enriched anode region 10 extends inside an inner portion of the anode region 8, from the front surface S$_a$, without contacting the underlying cathode region 4. In a top view the enriched anode region 10 may have approximately a circular or polygonal shape. In practice, the anode region 8 forms a main anode region, in which there may extend the enriched anode region 10.

The diode 1 further comprises a rear metallization structure 12, which extends underneath the rear surface S$_b$ of the cathode region 4. The rear metallization structure 12 may be, for example, a conductive layer or another type of conductive structure.

The diode 1 further comprises a field oxide region 14, which is formed for example by silicon oxide and extends on the front surface S$_a$, in direct contact with the underlying semiconductor body 2. As will be discussed in further detail below, the field oxide region 14 is formed from a first preliminary dielectric region 214.

Furthermore, the diode 1 comprises a front dielectric region 16, which extends above the field oxide region 14, wherewith it is in direct contact, and may for example include a dielectric layer stack, and may for example include a TEOS oxide layer and an overlying phosilicate glass layer. As will be discussed in further detail below, the front dielectric region 16 is formed from a second preliminary dielectric region 216.

The field oxide region 14 and the front dielectric region 16 are traversed by and include an opening 15, which faces and overlies the enriched anode region 10. A barrier region 17 extends inside the opening 15, which is formed by cobalt disilicide (CoSi$_2$) and overlies the front surface S$_a$, in direct contact with the underlying optional enriched anode region 10. A peripheral portion of the anode region 8, which is laterally offset with respect to the enriched anode region 10, is overlaid by the field oxide region 14; moreover, without any loss of generality, the portions of the guard ring 9 which are laterally offset with respect to the anode region 8 are overlaid by the field oxide region 14.

The diode 1 further comprises a front metallization structure 19, which includes at least one metallization region 18, which is formed by aluminum or by a silicon-free aluminum alloy and extends on the front dielectric region 16, as well as inside the opening 15, so as to contact the underlying barrier region 17. The front metallization structure 19 may be, for example, a conductive layer or another type of conductive structure.

In greater detail, an inner portion of the metallization region 18 extends inside the opening 15, in direct contact with the optional enriched anode region 10. A peripheral portion of the metallization region 18 extends on a portion of the front dielectric region 16 which laterally delimits the opening 15; this portion of the front dielectric region 16 and an underlying portion of the field oxide region 14 therefore separate the aforementioned peripheral portion of the metallization region 18 from the underlying semiconductor body 2.

The front metallization structure 19 may comprise further conductive regions; moreover, the front metallization structure 19 forms an electrical contact towards the outside world. For instance, a so-called "wire bonding" may be formed above the metallization region 18.

In practice, owing to the reduced doping of the anode region 8, the diode 1 is characterized by high switching speed and a limited increase in the forward voltage and therefore by a good trade-off between switching losses and conduction losses. Furthermore, the Applicant has observed how the use of the barrier region 17 allows to benefit from the advantages conferred by pure aluminum (in particular, a reduced resistivity and a lower defectiveness with respect to the aluminum-silicon alloy), without the diffusion of aluminum occurring inside the semiconductor body 2.

Figure 2:
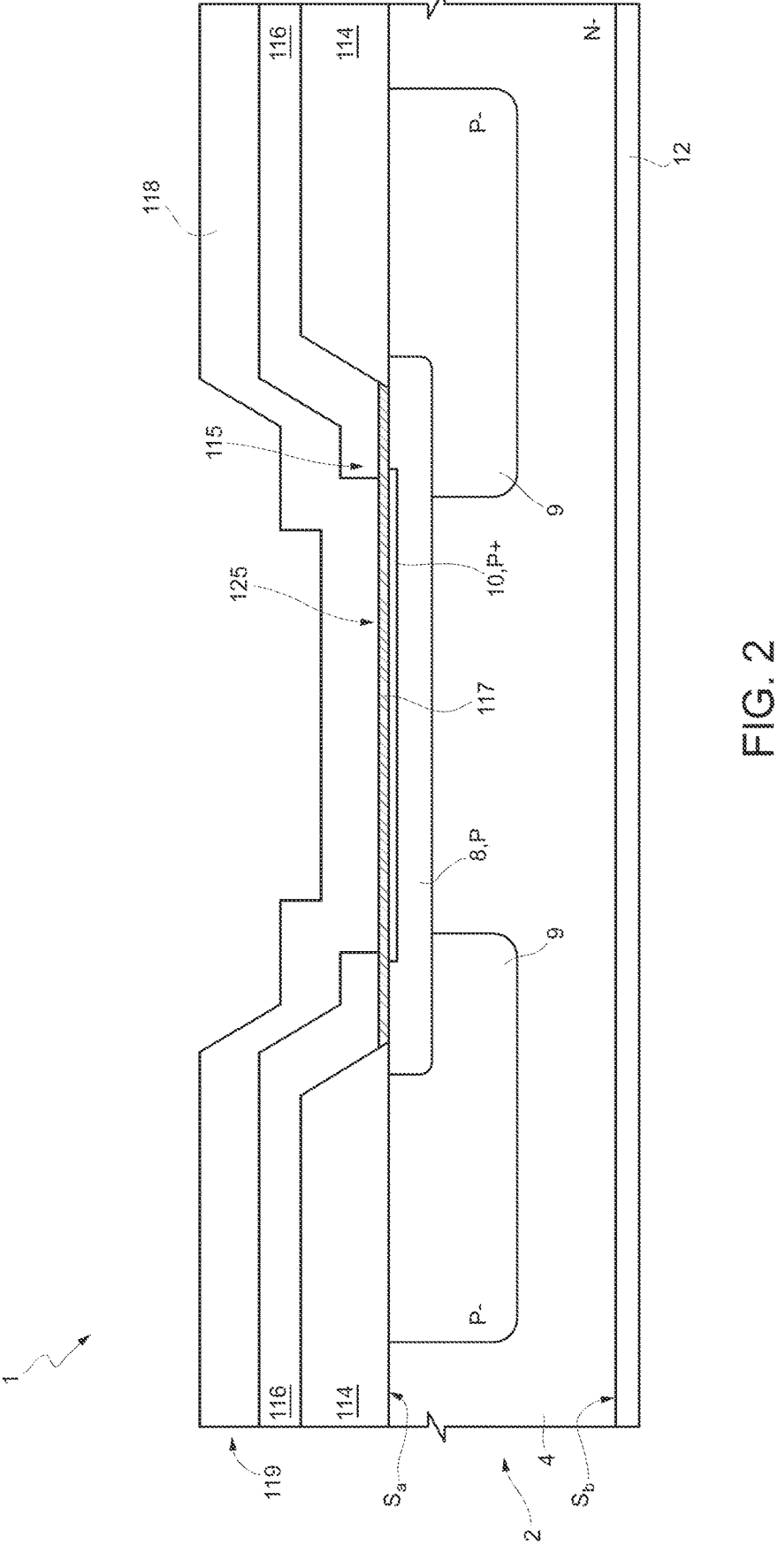

FIG. 2 shows a further embodiment, which is described with reference to the differences with respect to what has been shown in FIG. 1. Elements already present in FIG. 1 are indicated with the same reference signs, unless otherwise specified.

In detail, the field oxide region (here indicated with 114) is traversed by the opening (here indicated with 115), which faces and is on both the enriched anode region 10 (optional), and therefore the inner portion of the anode region 8, and the peripheral portion of the anode region 8, which, as mentioned, is laterally offset with respect to the enriched anode region 10.

The barrier region (here indicated with 117) extends into the opening 115, so as to overlie, in direct contact, the enriched anode region 10 and the peripheral portion of the anode region 8.

The front dielectric region (here indicated with 116) extends, as well as on the field oxide region 114, also on the portion of barrier region 117 that overlies the peripheral portion of the anode region 8, in direct contact. Moreover, the front dielectric region 116 is traversed by a respective opening 125, which is referred to as the top opening 125.

In detail, the top opening 125 faces the portion of barrier region 117 that overlies the enriched anode region 10, and therefore the inner portion of the anode region 8.

The metallization region (here indicated with 118) extends on the front dielectric region 116 and inside the top opening 125, so as to contact the portion of barrier region 117 that overlies the optional enriched anode region 10.

In practice, in the embodiment shown in FIG. 2, the barrier region 117 forms a shield which extends laterally with respect to the top opening 125, and therefore also with respect to the portion of metallization region 118 that contacts the portion of barrier region 117 that overlies the enriched anode region 10. The aforementioned shield is also to prevent the diffusions of aluminum towards the peripheral portion of the anode region 8, and in particular the diffusions that may occur at the bottom corner of the top opening 125, in the direction of the peripheral portion of the anode region 8.

That said, the embodiment shown in FIG. 1 may be manufactured by the process described hereinbelow.

Figure 3:
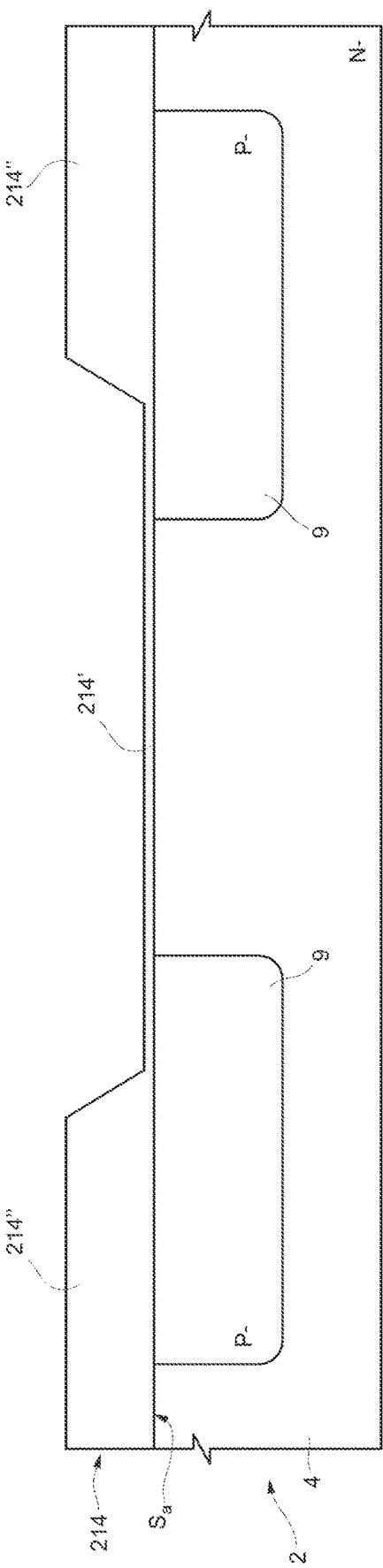
FIGS. 3-13 schematically show cross-sections of the diode shown in FIG. 1, during successive steps of a manufacturing process.

Initially, as shown in FIG. 3, in a fairly well known way there are formed the cathode region 4, the guard ring 9 and a first preliminary dielectric region 214, which extends on the front surface S$_a$ and includes a thin portion 214', which extends on a portion of cathode region 4 surrounded by the guard ring 9 and on an inner portion of the guard ring 9, and a thick portion 214", which is thicker than the thin portion 214', laterally surrounds the thin portion 214', wherewith it forms a single piece, and overlies an outer portion of the guard ring 9. For instance, the thin portion 214' has a thickness comprised between 10 and 100 nm. The thick portion 214" has a thickness at least equal to 100 nm. The first preliminary dielectric region 214 is intended to form the field oxide region 14.

In greater detail, the first preliminary dielectric region 214 is formed by thermal oxide. For instance, the first preliminary dielectric region 214 may be formed by carrying out a first thermal growth, followed by a selective removal of part of the grown thermal oxide, such first thermal growth being then followed by a second thermal growth to form the thin portion 214', where the aforementioned part of grown thermal oxide, as well as the thick portion 214", which comprises thermal oxide grown during the first and the second thermal growths, had previously been selectively removed.

Figure 4:
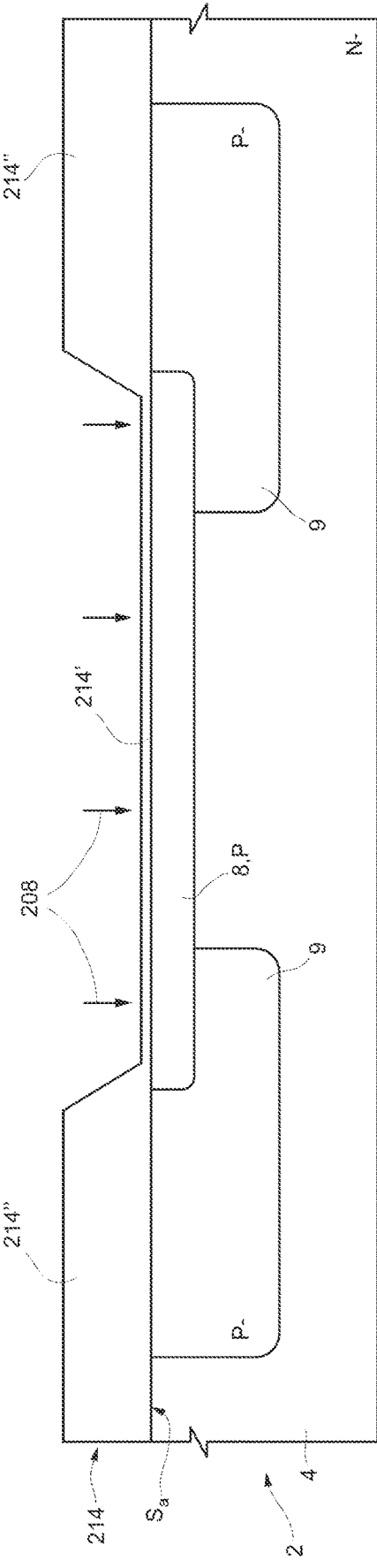

Then, as shown in FIG. 4, an ion implantation process of P-type doping species (for example, boron), indicated by arrows 208, is carried out, followed by a thermal activation process; these operations lead to the formation of the anode region 8, which extends underneath the thin portion 214' of the first preliminary dielectric region 214, therefore it is laterally offset with respect to the thick portion 214", since the first preliminary dielectric region 214 functions as a mask for the implant. Moreover, the implant may occur, for example, with a dosage comprised between 1e12 cm$^{-2}$ and 1e13 cm$^{-2}$ and with energy comprised between 50 and 150 KeV.

Figure 5:
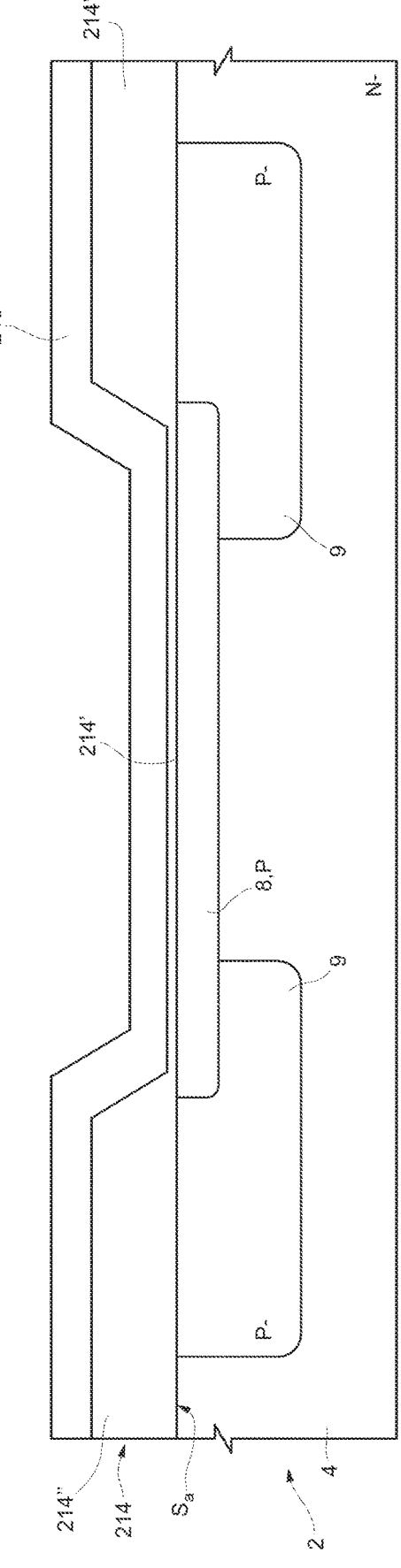

Subsequently, as shown in FIG. 5, above the first preliminary dielectric region 214 a second preliminary dielectric region 216 is formed, intended to form the front dielectric region 16.

Figure 6:
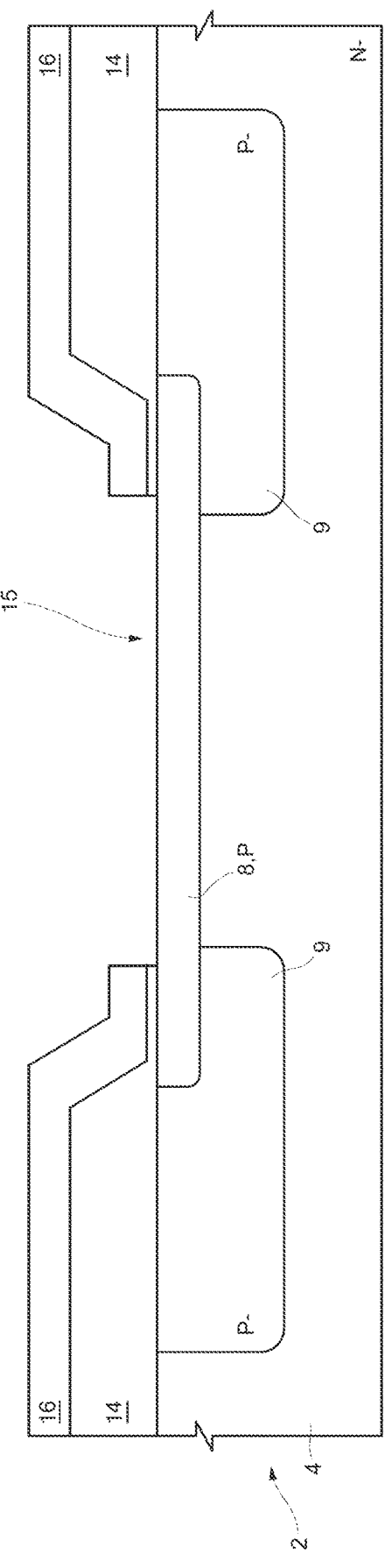

Then, as shown in FIG. 6, a plasma or acid etch is performed, by using a respective mask, so as to selectively remove a part of the thin portion 214' of the first preliminary dielectric region 214 and an overlying portion of the second preliminary dielectric region 216, so as to form the opening 15. The remaining portions of the first and the second preliminary dielectric regions 214, 216 form the field oxide region 14 and the front dielectric region 16, respectively.

Figure 7:
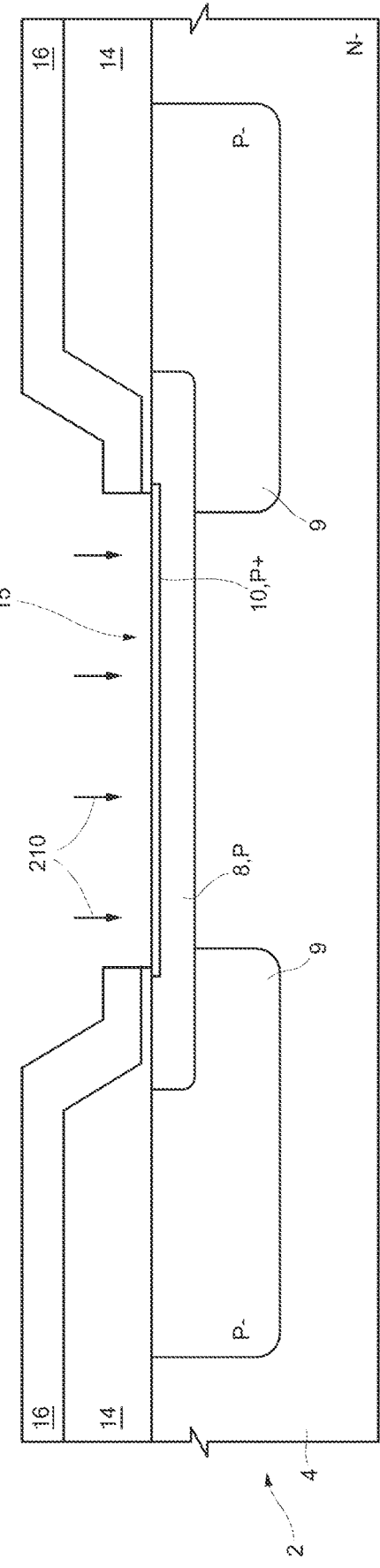

Then, as shown in FIG. 7, a further (optional) ion implantation process of P-type doping species, indicated by arrows 210, is carried out, followed by a respective thermal activation process; the field oxide region 14 and the front dielectric region 16 function as a corresponding mask, in such a way that these operations lead to the formation of the enriched anode region 10. Moreover, the implant may occur, for example, with a dosage comprised between 1e13 cm$^{-2}$ and 1e16 cm$^{-2}$ and with energy comprised between 10 and 100 KeV. Nevertheless, this P-type enrichment implant is optional and depends on the required Qrr vs VF trade-off.

Figure 8:
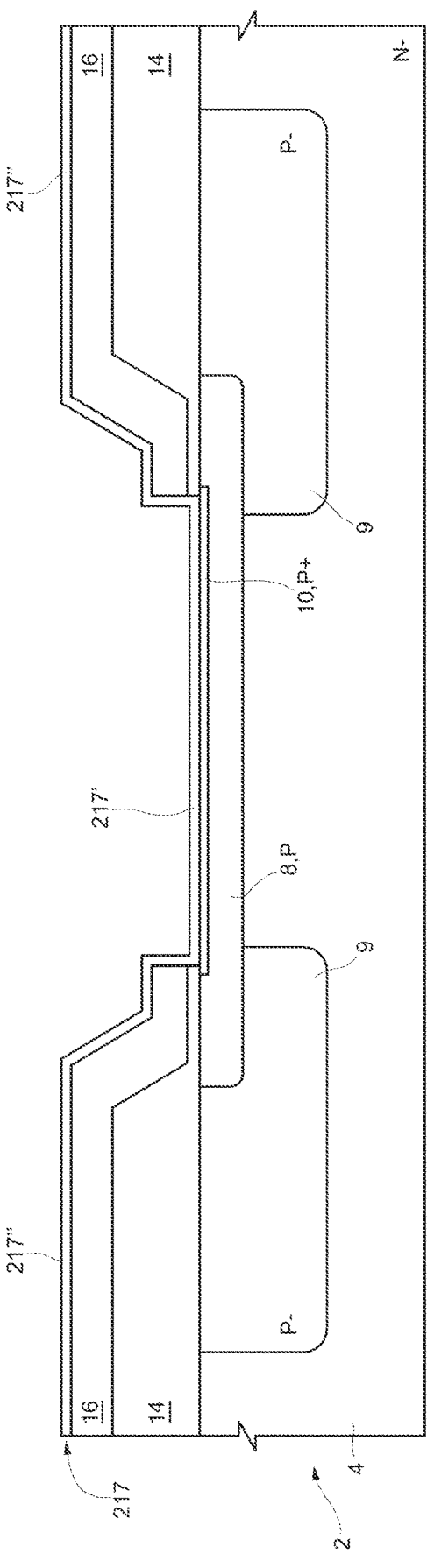

Subsequently, as shown in FIG. 8, a cobalt sputtering process is performed, in order to form a first metal layer 217, which extends on the front dielectric region 16 and inside the opening 15, in direct contact with the enriched anode region 10.

In greater detail, the portion of the first metal layer 217 placed in contact with the semiconductor material (in particular, with the enriched anode region 10) is indicated with 217', while the portion of the first metal layer 217 spaced apart from the semiconductor material, since it is arranged on the front dielectric region 16, is indicated with 217".

Figure 9:
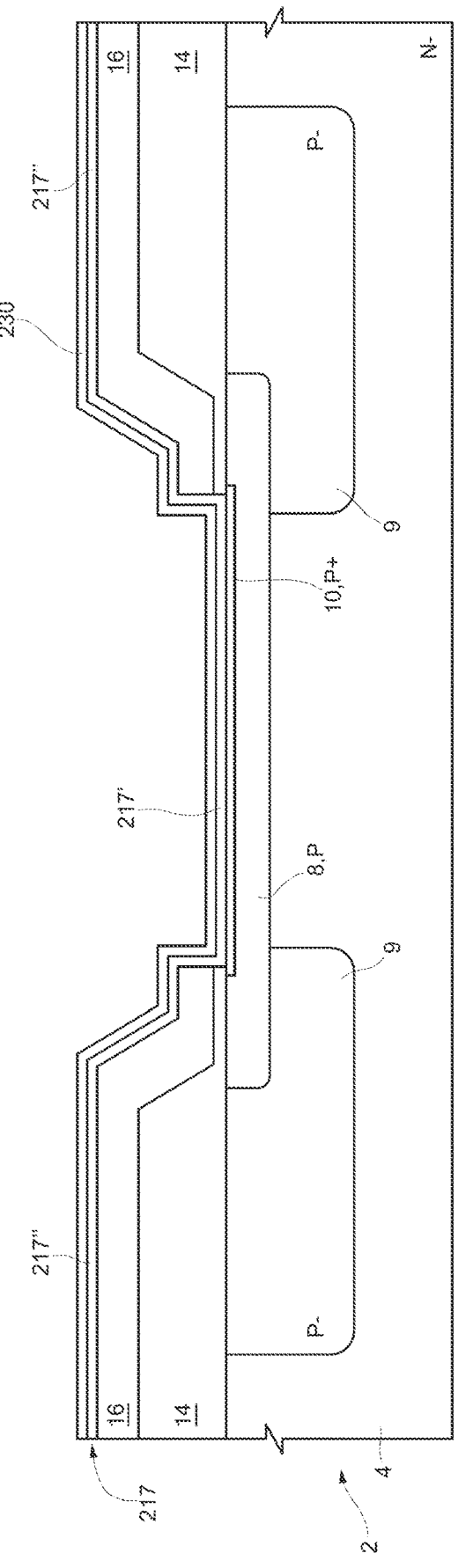

Then, as shown in FIG. 9, a second metal layer 230 is formed on the first metal layer 217, for example by sputtering. The second metal layer 230 is formed for example by titanium nitride (TiN) and performs a protective function towards the underlying first metal layer 217. In any case, the formation of the second metal layer 230 is optional.

Figure 10:
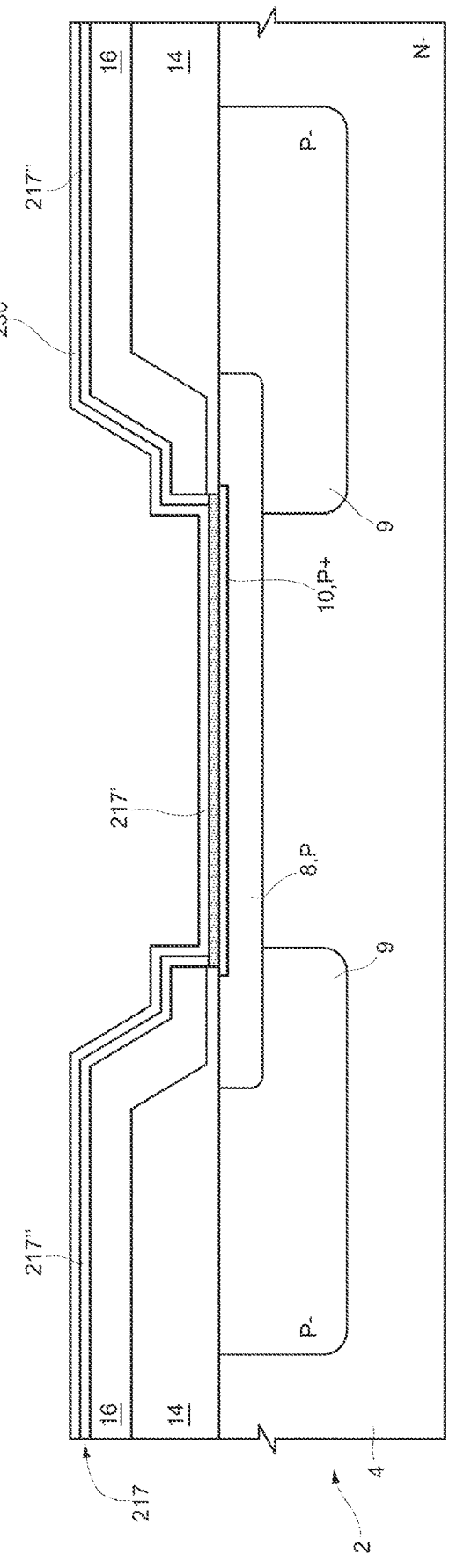

Then, as shown in FIG. 10, a so-called rapid thermal process (RTP) is performed, at a temperature comprised, for example, between 400 and 500° C. and with a duration, for example, comprised between 20 and 60 seconds. This causes a silicidation of the cobalt placed in contact with the silicon; in other words, the portion 217' of the first metal layer 217 is transformed into cobalt silicide (CoSi), while the portion 217" of the first metal layer 217 remains of cobalt.

Figure 11:
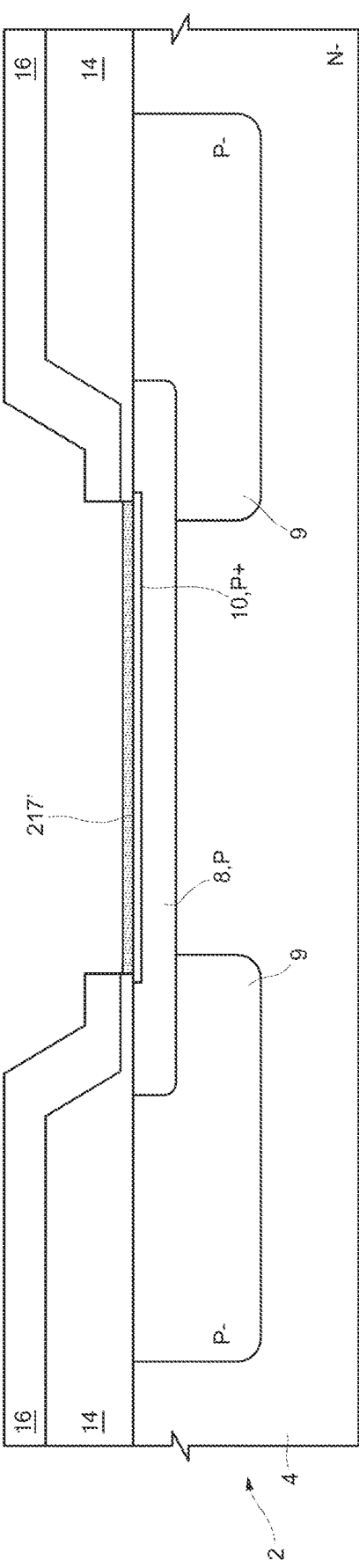

Subsequently, as shown in FIG. 11, an etch is performed (for example of the wet type, although it may also be of the dry type), in order to remove the second metal layer 230 and the cobalt that has not transformed into cobalt silicide, that is the portion 217" of the first metal layer 217.

Figure 12:
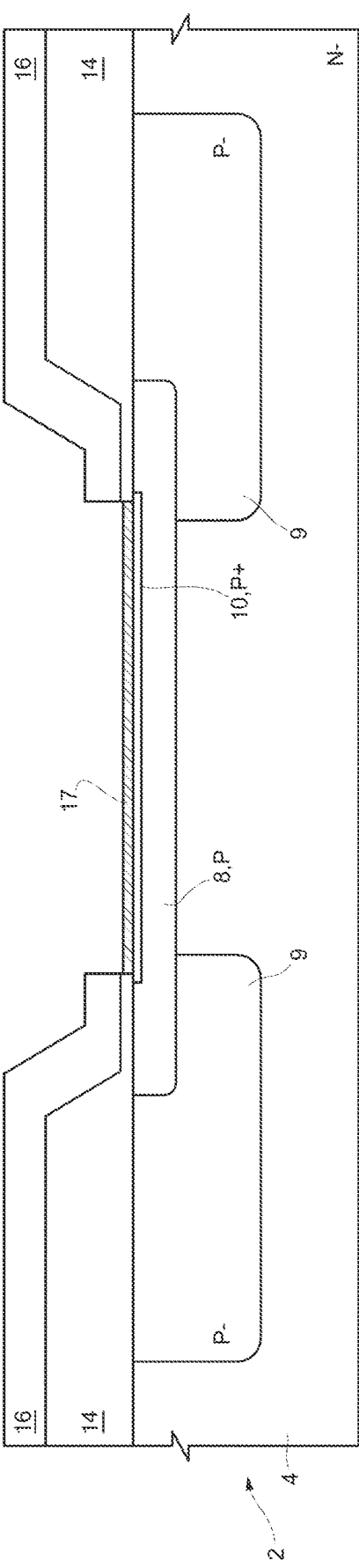

Then, as shown in FIG. 12, a further rapid thermal process is performed, at a temperature comprised for example between 700 and 950° C. and with a duration, for example, comprised between 30 and 120 seconds, so as to transform the cobalt silicide which forms the portion 217' of the first metal layer 217 into cobalt disilicide. In this manner, the portion 217' of the first metal layer 217 is transformed into the barrier region 17. In this regard, cobalt disilicide has a lower resistivity than cobalt silicide.

Figure 13:
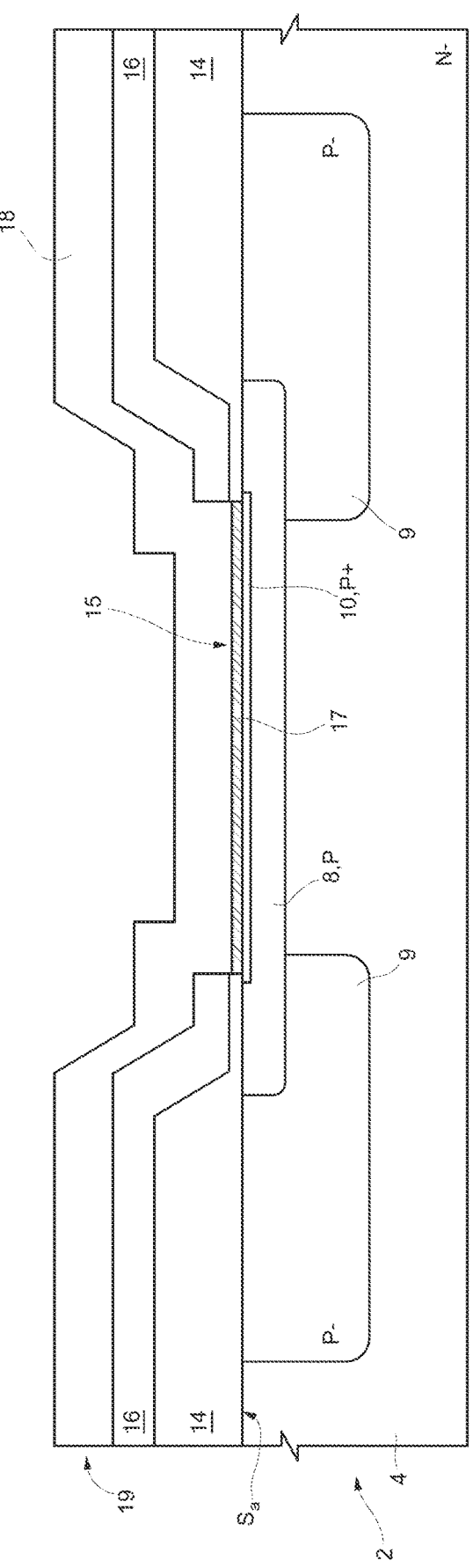

Subsequently, as shown in FIG. 13, the metallization region 18 is formed, for example by sputtering.

Then, the manufacturing process may proceed in a fairly well known way and therefore not shown, for example with the formation of the rear metallization structure 12.

Instead, as regards the embodiment shown in FIG. 2, it may be manufactured by following the process described hereinbelow.

Initially, the same operations described with reference to FIGS. 3 and 4 are performed.

Figure 14:
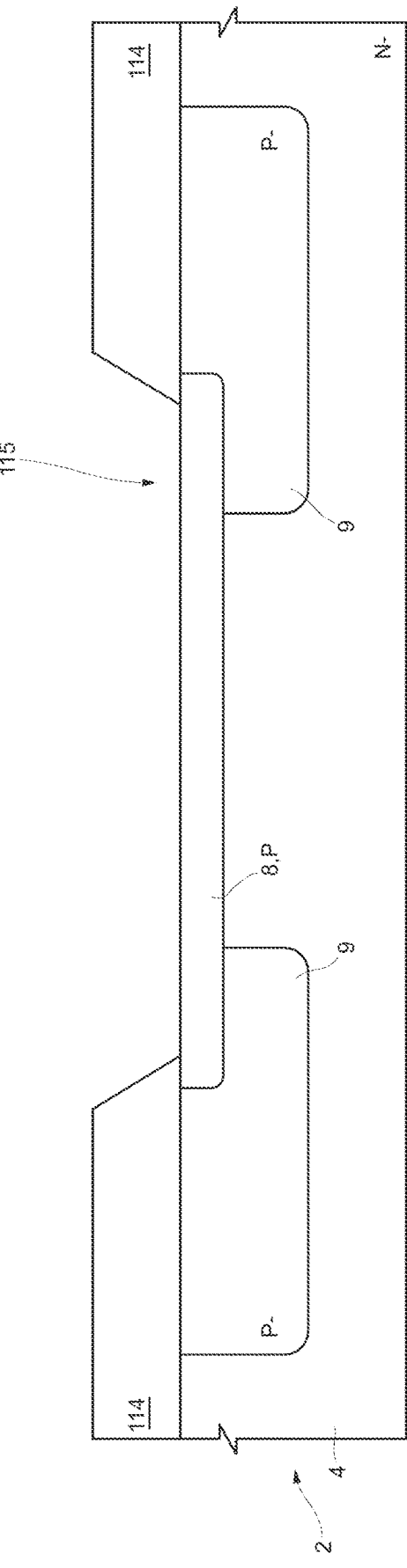
FIGS. 14-23 schematically shown cross-sections of the diode shown in FIG. 2, during successive steps of a manufacturing process.

Subsequently, an etch is performed (for example of the wet type, although it may also be of the dry type) in order to selectively remove the thin portion 214' of the first preliminary dielectric region 214, so as to expose the anode region 8. In this manner, as shown in FIG. 14, the opening 115 is formed; moreover, the etch does not involve the thick portion 214" of the first preliminary dielectric region 214, which forms the field oxide region 114.

Figure 15:
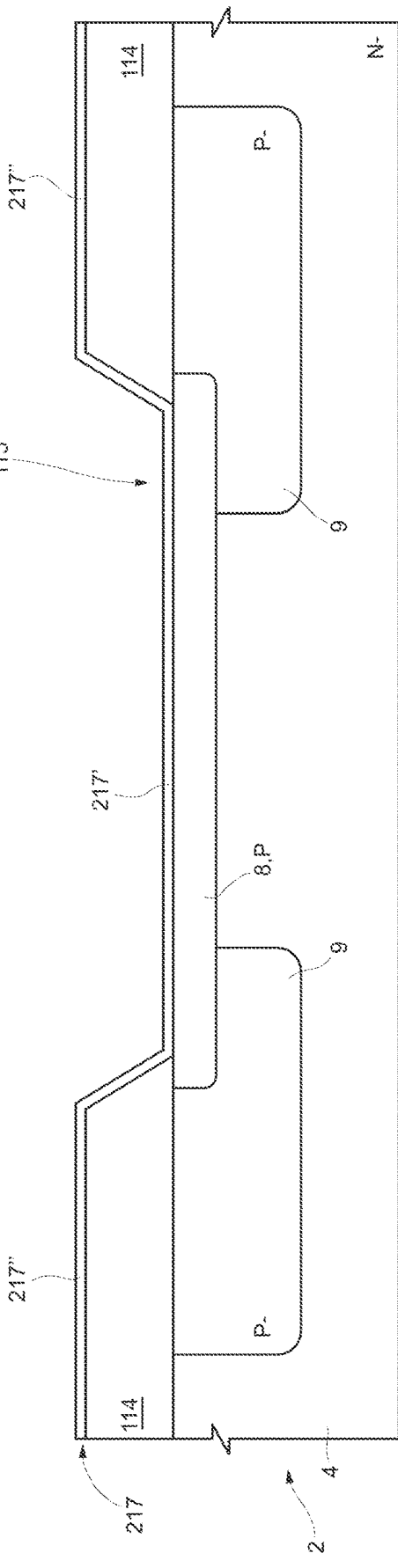

Then, as shown in FIG. 15, a cobalt sputtering process is performed, in order to form the first metal layer 217, which extends on the field oxide region 114 and inside the opening 115, in direct contact with the anode region 8.

In greater detail, the portion of the first metal layer 217 placed in contact with the semiconductor material (in particular, with the anode region 8) is again indicated with 217', while the portion of the first metal layer 217 spaced apart from the semiconductor material, since it is arranged on the field oxide region 114, is indicated with 217".

Figure 16:
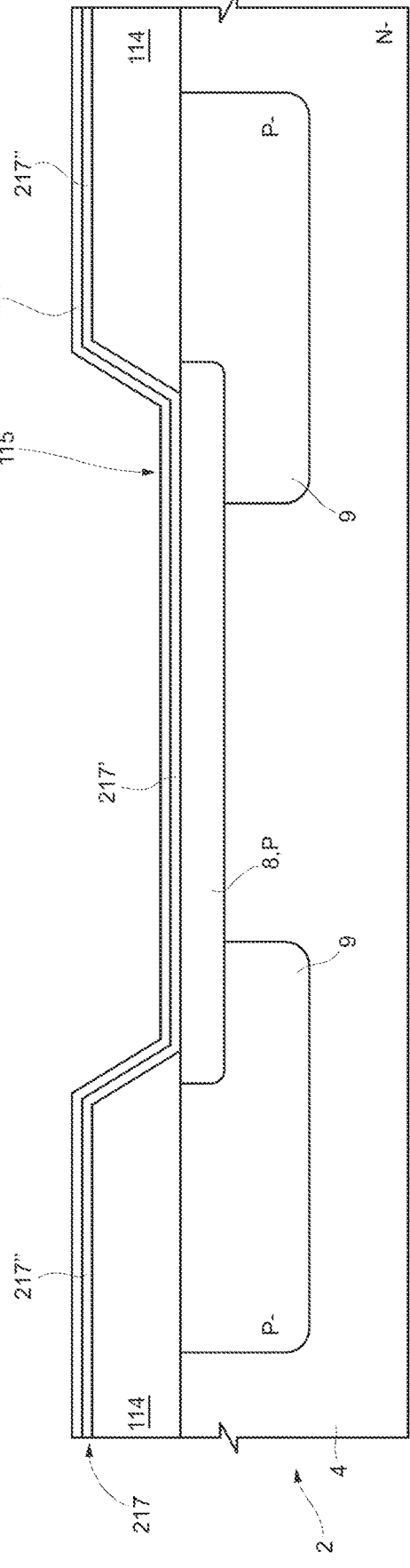

Subsequently, as shown in FIG. 16, the aforementioned second metal layer 230, whose presence is in any case optional, as previously explained, is formed on the first metal layer 217 by sputtering.

Figure 17:
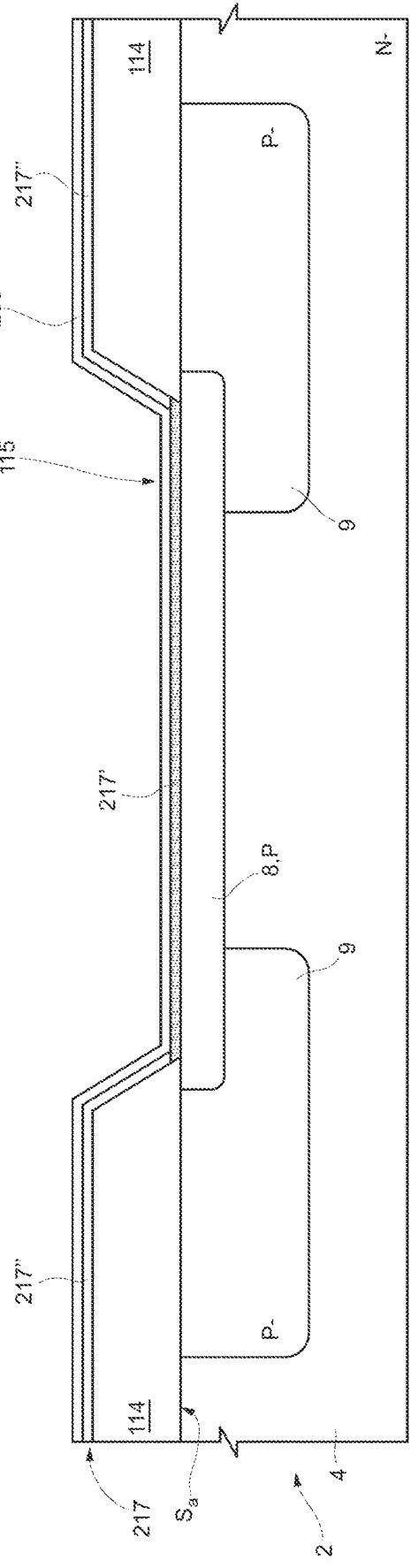

Then, as shown in FIG. 17, a rapid thermal process is performed, at a temperature comprised, for example, between 400 and 500° C. and with a duration, for example, comprised between 20 and 60 seconds. This causes a silicidation of the cobalt placed in contact with the silicon; in other words, the portion 217' of the first metal layer 217 is transformed into cobalt silicide (CoSi), while the portion 217" of the first metal layer 217 remains of cobalt.

Figure 18:
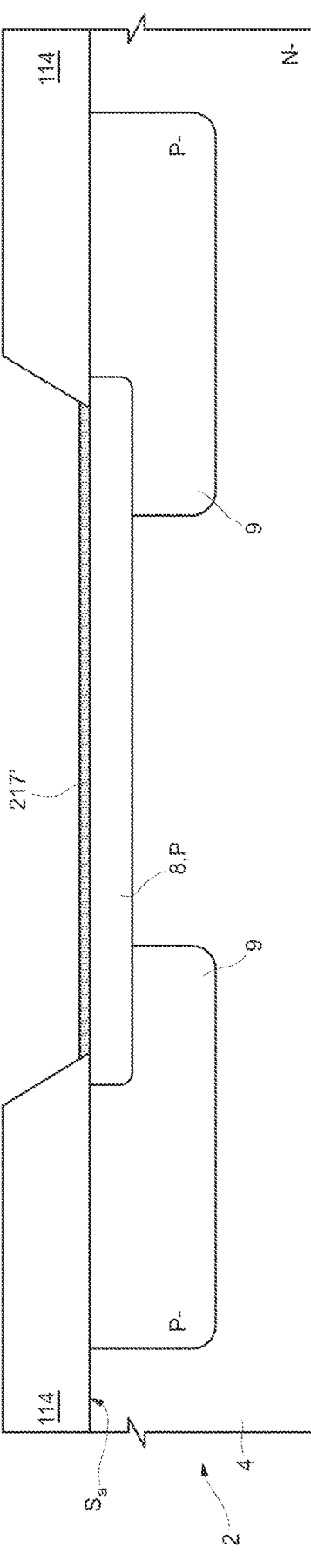

Subsequently, as shown in FIG. 18, an etch is performed (for example of the wet type, although it may also be of the dry type), in order to remove the second metal layer 230 and the cobalt that has not transformed into cobalt silicide, that is the portion 217'' of the first metal layer 217.

Figure 19:
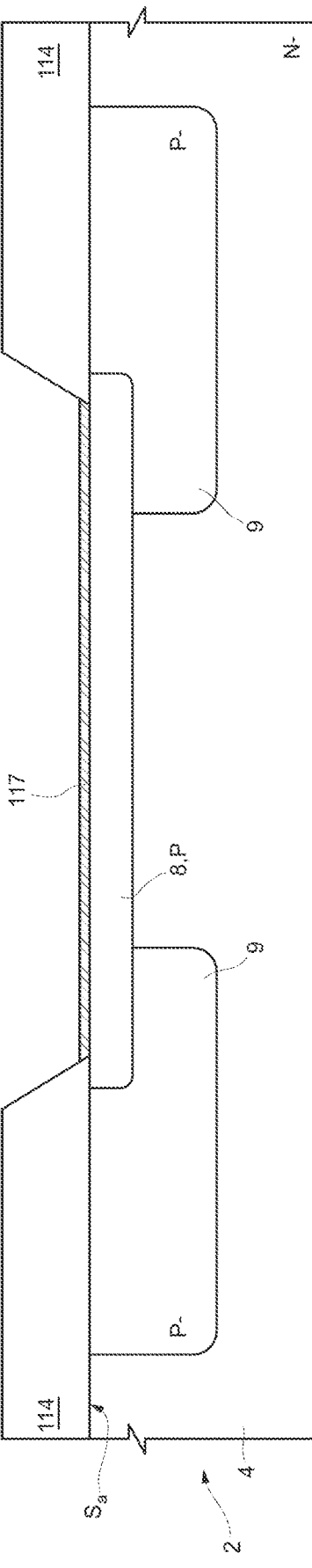

Then, as shown in FIG. 19, a further rapid thermal process is performed, at a temperature comprised for example between 700 and 950° C. and with a duration, for example, comprised between 30 and 120 seconds, so as to transform the cobalt silicide which forms the portion 217' of the first metal layer 217 into cobalt disilicide. In this manner, the portion 217' of the first metal layer 217 is transformed into the barrier region 117.

Figure 20:
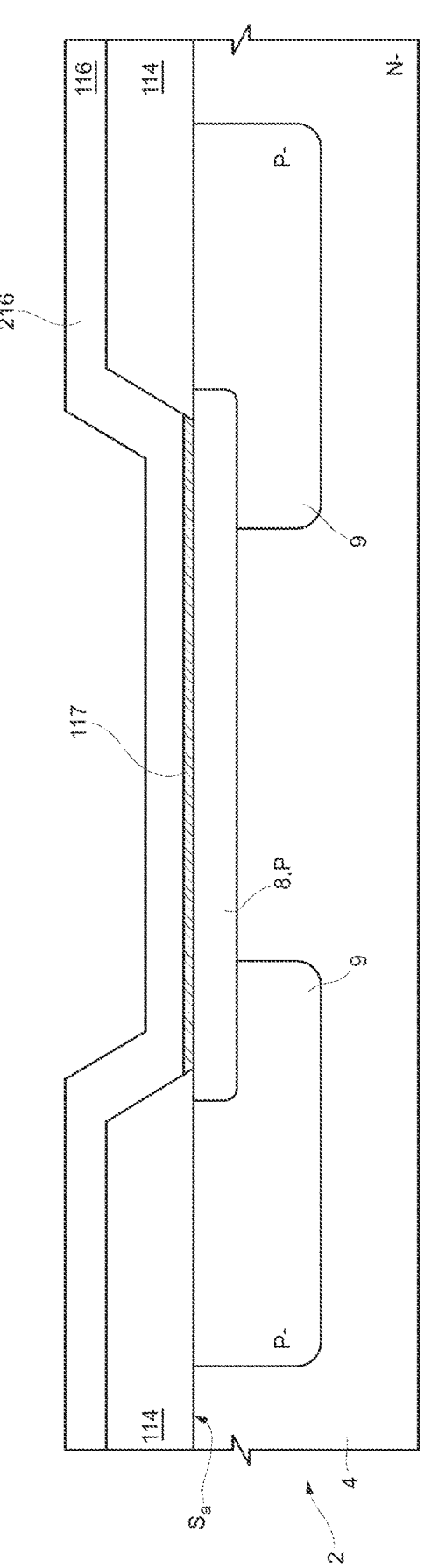

Subsequently, as shown in FIG. 20, the second preliminary dielectric region 216 is formed on the field oxide region 114 and on the barrier region 117.

Figure 21:
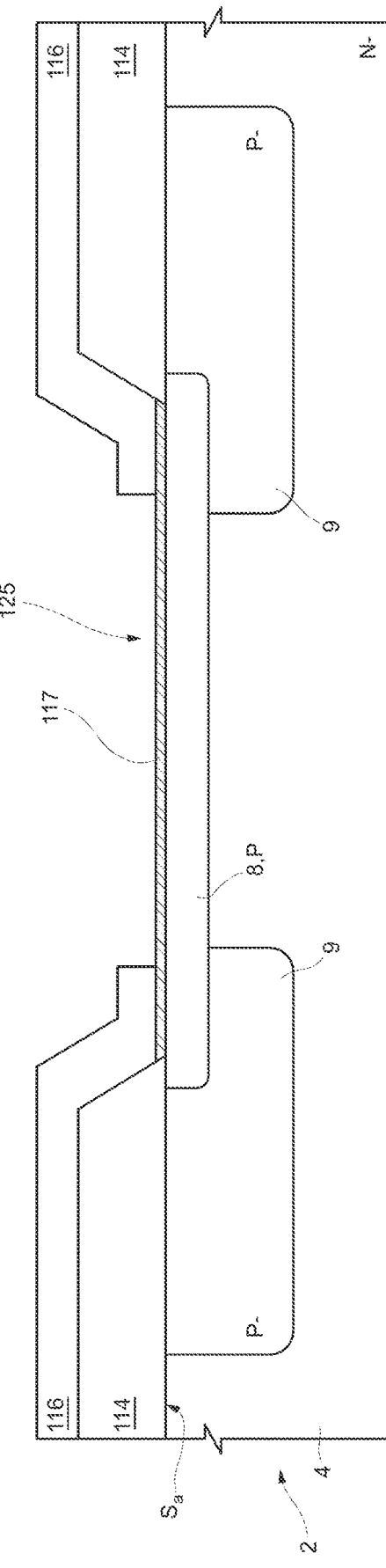

Then, as shown in FIG. 21, an etch is performed (for example of the wet type, although it may also be of the dry type), by using a respective mask, so as to selectively remove a portion of the second preliminary dielectric region 216 and form the top opening 125. The remaining portions of the second preliminary dielectric region 216 form the front dielectric region 16.

Figure 22:
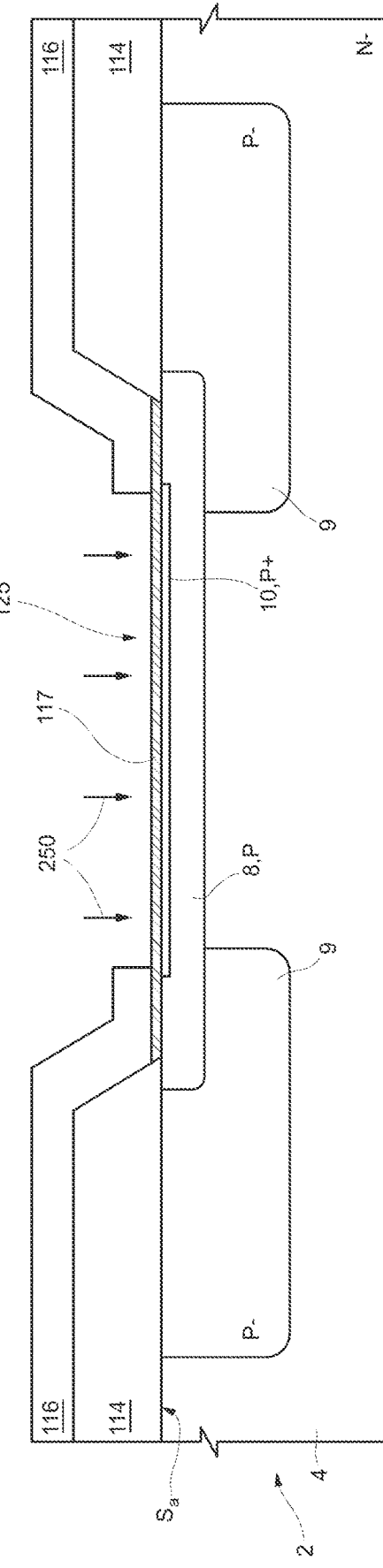

Then, as shown in FIG. 22, a further (optional) ion implantation process of P-type doping species, indicated by arrows 250, is carried out followed by a respective thermal activation process; the front dielectric region 116 functions as a corresponding mask, in such a way that these operations lead to the formation of the enriched anode region 10. Moreover, the implant may occur, for example, with a dosage comprised between 1e15 cm$^{-2}$ and 1e16 cm$^{-2}$ and with energy comprised between 10 and 100 KeV, while the thermal activation process may occur, for example, at a temperature comprised between 600 and 900° C. and with a duration comprised between 30 and 90 minutes. Nevertheless, this P-type enrichment implant is optional and depends on the required Qrr vs VF trade-off.

Figure 23:
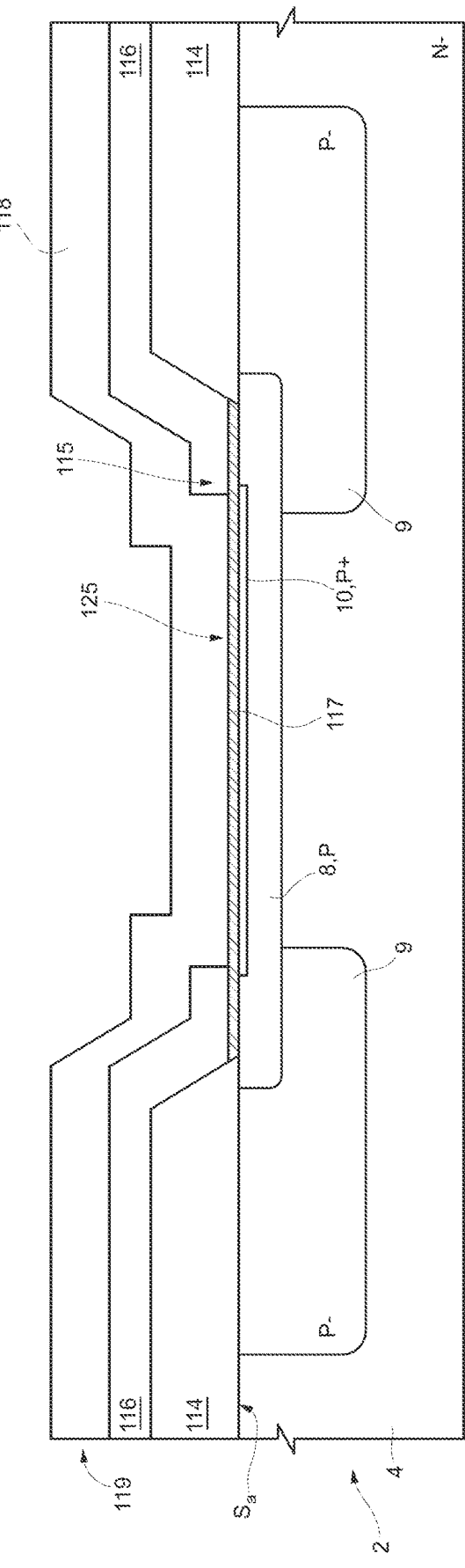

Then, as shown in FIG. 23, the metallization region 118 is formed, for example by sputtering.

Subsequently, the manufacturing process may proceed in a manner known per se and therefore not described.

The advantages that the present solution affords are clear from what has been previously described and illustrated. In practice, the barrier region and the metallization region form an improved contact structure with respect to the prior art.

In particular, the use of a cobalt disilicide barrier region allows to form a metal-semiconductor junction with ohmic behavior in a diode with an anode region having a low P-type doping level, i.e., in a diode with high switching speed, without using platinum silicide or silicon-enriched aluminum. In this manner, the diode exhibits a reduced forward voltage with respect to what may be obtained in case of a platinum silicide barrier region; moreover, the Applicant has observed how the diode has a temperature coefficient with a modulus that is reduced with respect to what occurs in case of a platinum silicide barrier region, as well as positive in a range of current values comprised between 120 A and 200 A.

Finally, it is clear that modifications and variations may be made to what has been described and illustrated so far, without however departing from the scope of the present disclosure.

Figure 24:
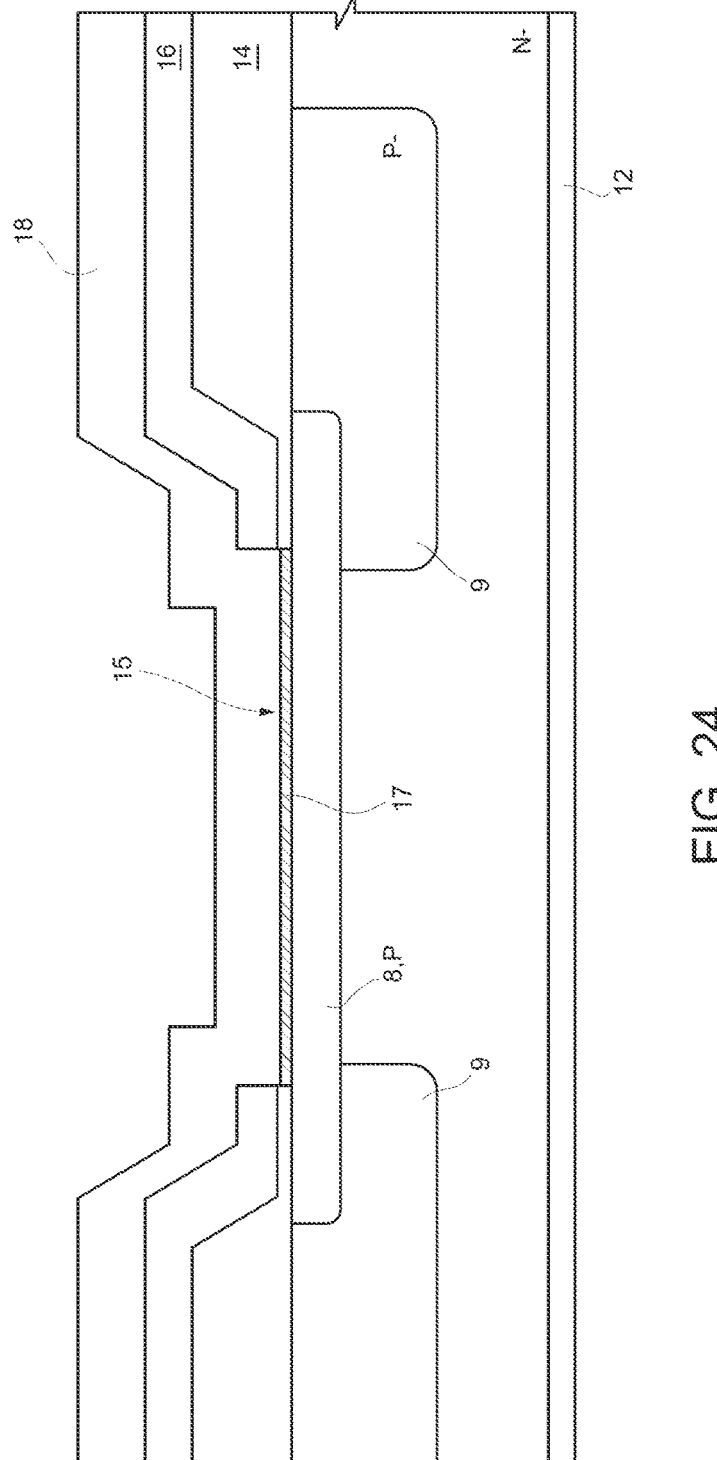
Figure 25:
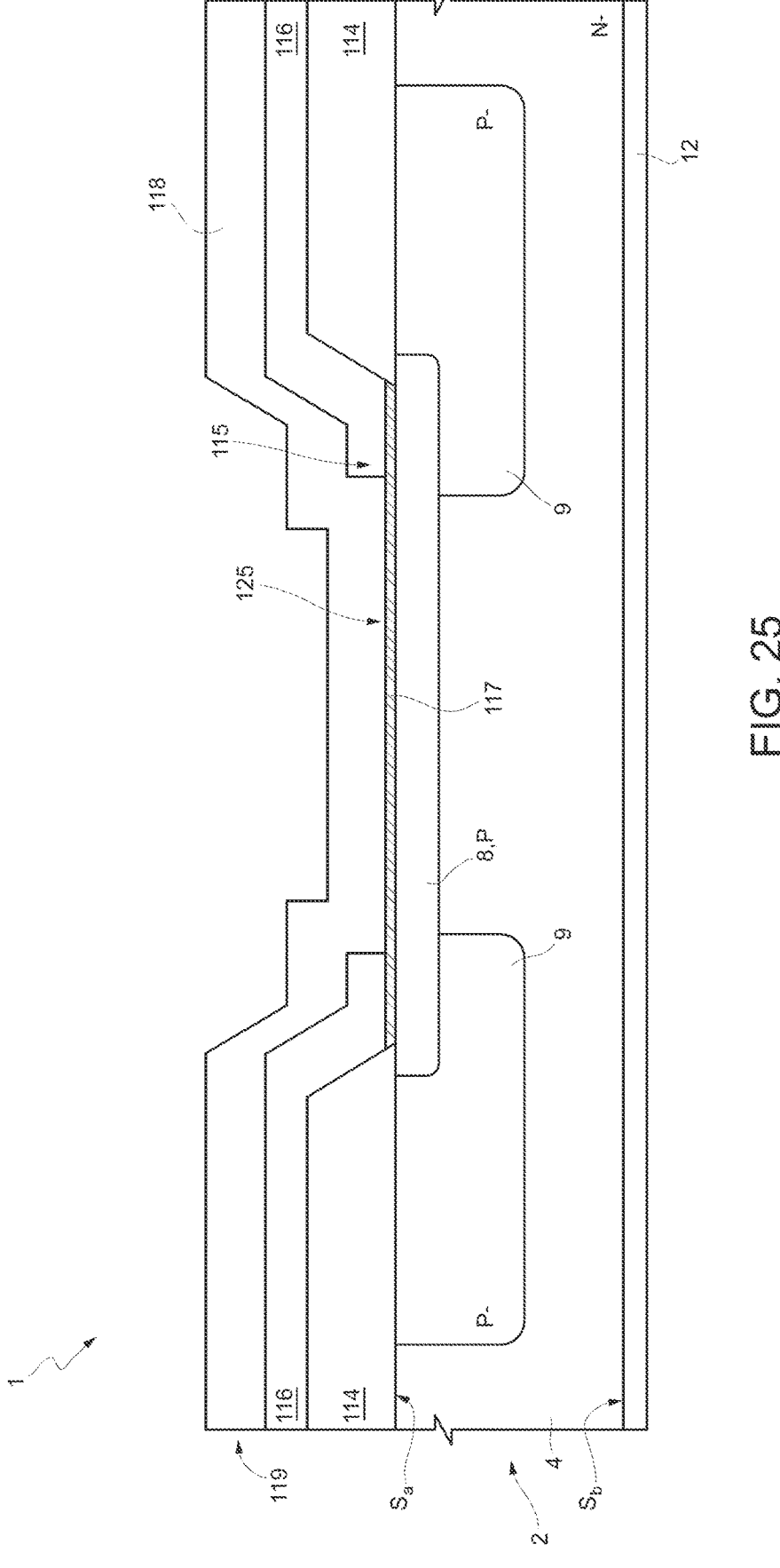

For example, the guard ring and/or the enriched anode region may be absent, as previously explained. In case the enriched anode region 10 is absent, in the embodiment of the type shown in FIG. 1 there occurs that the barrier region 17 contacts the inner portion of the anode region 8, as shown in FIG. 24; furthermore, in the embodiment of the type shown in FIG. 2 there occurs that the barrier region 117 contacts either the peripheral portion and the inner portion of the anode region 8, as shown in FIG. 25. In the manufacturing process, the ionic implantation process shown in FIG. 7 and FIG. 22 is thus not carried out.

The composition of the front dielectric region may be different from what has been described.

Regarding the manufacturing process, the formation of the second metal layer 230 may be absent, as previously mentioned. Moreover, cobalt disilicide may be obtained from cobalt by performing a single rapid thermal process, i.e., without providing for an initial transformation into cobalt silicide, however performing a double rapid thermal process allows to avoid the formation of defectiveness at the edges of the barrier regions.

In addition, all the ion implantation operations described may provide for the use of respective additional masks.

Figure 26:
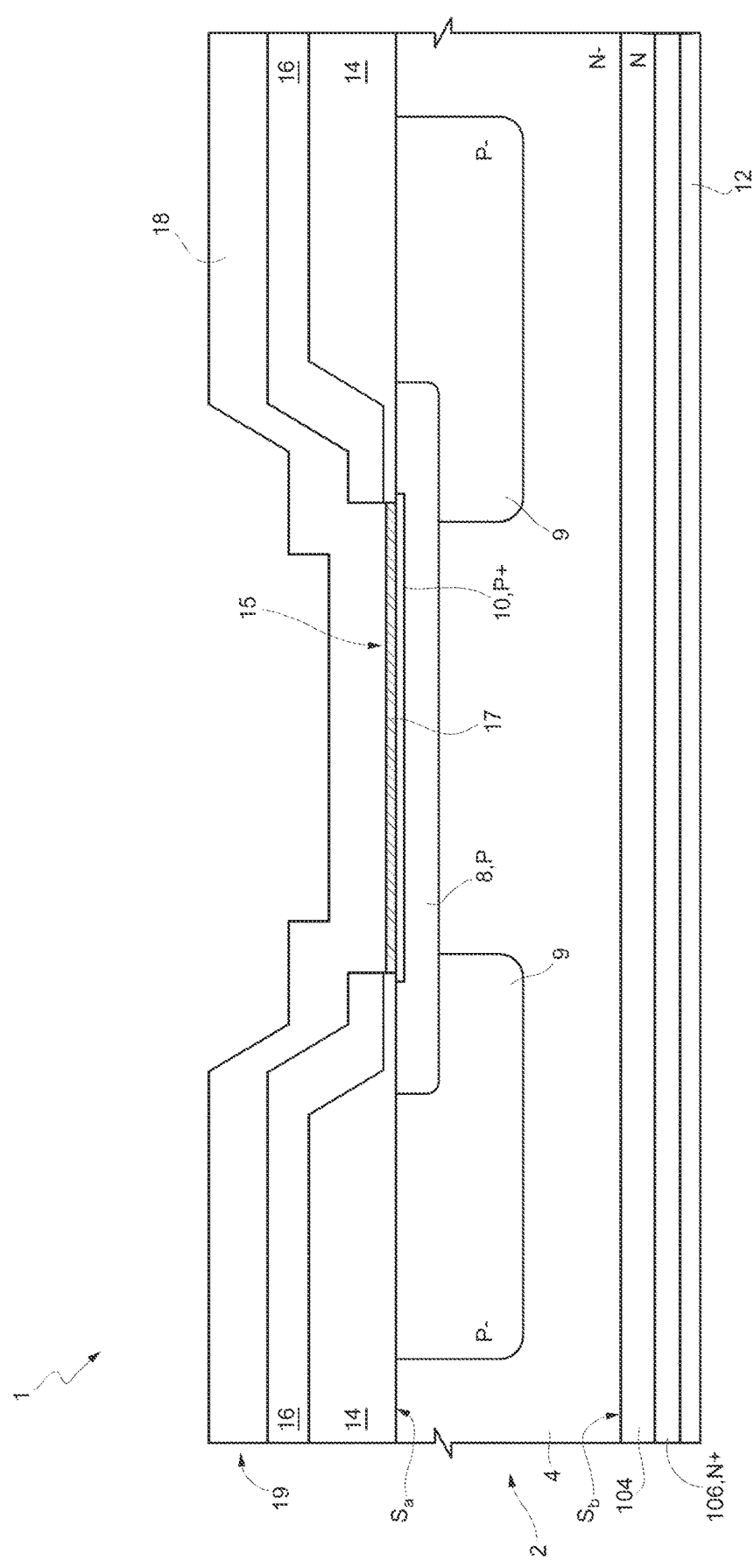

Finally, the semiconductor body 2 may have a structure different from what has been described, as shown as an example in FIG. 26, which, purely by way of example, refers to the embodiment shown in FIG. 1; however, the same considerations apply also with reference to the other embodiments. More generally speaking, the embodiment in FIG. 26 refers to a more general pin diode structure.

In detail, the semiconductor body 2 comprises a field stop region 104, of the N type, and an enriched cathode region 106, of the N+ type. In particular, the field stop region 104 extends under the cathode region 4, in direct contact, and has a peak doping level as an example in the order of $10^{16}$ cm$^{-3}$; the enriched cathode region 106 extends under the field stop region 104, in direct contact, and has a peak doping level as an example comprised between $1*10^{19}$ cm$^{-3}$ and $1*10^{20}$ cm$^{-3}$. The bottom metallization structure 12 extends under the enriched cathode region 106, in direct contact.

A diode may be summarized as including a semiconductor body (2) of silicon including a cathode region (4), which has a first conductivity type and is delimited by a front surface (S$_a$); and an anode region (8,10), which has a second conductivity type and extends into the cathode region (4) from the front surface (S$_a$); said diode (1) further including a barrier region (17;117) of cobalt disilicide, arranged on the anode region (8,10); and a metallization region (18; 118) of aluminum or of an aluminum alloy, arranged on the barrier region (17;117); characterized in that the barrier region (17;117) contacts the anode region (8,10).

The anode region (8,10) may have a P-type conductivity and may comprise a main anode region (8), which extends in the cathode region (4) starting from the front surface (S$_a$) and has a peak doping level between $1*10^{14}$ cm$^{-3}$ and $1*10^{16}$ cm$^{-3}$.

The main anode region (8) may include an inner portion and a peripheral portion, said diode (1) may further include a field oxide region (14), which extends on the semiconductor body (2); and a front dielectric region (16), arranged on the field oxide region (14). The field oxide region (14) and the front dielectric region (16) may be traversed by a first opening (15), which faces the inner portion of the main anode region (8), with the field oxide region (14) extending on the peripheral portion of the main anode region (8). The barrier region (17) may extend inside the first opening (15), in direct contact with the inner portion of the main anode region (8).

The metallization region (18) may extend on the front dielectric region (16) and inside the first opening (15).

The main anode region (8) may include an inner portion and a peripheral portion, said diode (1) may further include a field oxide region (114), which extends on the semiconductor body (2) and may be traversed by a first opening (115), which faces the inner portion and the peripheral portion of the main anode region (8), the barrier region (117) extending inside the first opening (115), on the inner portion and on the peripheral portion of the main anode region (8); and a front dielectric region (116), which extends on the field oxide region (114) and on a portion of the barrier region (117) arranged on the peripheral portion of the main anode region (8), said front dielectric region (116) being traversed by a second opening (125) which faces a portion of the barrier region (117) arranged on the inner portion of the main anode region (8). The metallization region (118) may extend on the front dielectric region (116) and on said portion of the barrier region (117) arranged on the inner portion of the main anode region (8).

The main anode region (8) may include an inner portion and a peripheral portion. The anode region (8,10) may further include an enriched anode region (10), which extends into the inner portion of the main anode region (8) and has a higher doping level than the doping level of the main anode region (8). The diode (1) may include a field oxide region (14), which extends on the semiconductor body (2); and a front dielectric region (16), arranged on the field oxide region (14). The field oxide region (14) and the front dielectric region (16) are traversed by a first opening (15) that faces the enriched anode region (10), the field oxide region (14) extending on the peripheral portion of the main anode region (8). The barrier region (17) extends inside the first opening (15), on the enriched anode region (10).

The main anode region (8) may include an inner portion and a peripheral portion; and the anode region (8,10) may include an enriched anode region (10), which extends into the inner portion of the main anode region (8) and has a higher doping level than the doping level of the main anode region (8). The diode may include a field oxide region (114), which extends on the semiconductor body (2) and is traversed by a first opening (115), which faces the enriched anode region (10) and the peripheral portion of the main anode region (8), the barrier region (117) extending inside the first opening (115), on the enriched anode region (10) and the peripheral portion of the main anode region (8); and a front dielectric region (116), which extends on the field oxide region (114) and on a portion of the barrier region (117) arranged on the peripheral portion of the main anode region (8), said front dielectric region (116) being traversed by a second opening (125) which faces a portion of the barrier region (117) arranged on the enriched anode region (10). The metallization region (118) may extend on the front dielectric region (116) and on said portion of the barrier region (117) arranged on the enriched anode region (10).

A process for manufacturing a diode (1), may be summarized as including forming a semiconductor body (2) of silicon including a cathode region (4), which has a first conductivity type and is delimited by a front surface (S$_a$), and an anode region (8,10), which has a second conductivity type and extends into the cathode region (4) from the front surface (S$_a$); on the anode region (8,10), forming a barrier region (17;117) of cobalt disilicide; and on the barrier region (17;117), forming a metallization region (18;118) of aluminum or of an aluminum alloy; characterized in that the barrier region (17;117) contacts the anode region (8,10.

The anode region (8,10) may have a P-type conductivity and include a main anode region (8), which extends in the cathode region (4) starting from the front surface (S$_a$) and have a peak doping level between $1*10^{14}$ cm$^{-3}$ and $1*10^{16}$ cm$^{-3}$.

The manufacturing process may further include, on the semiconductor body (2), forming a first preliminary dielectric region (214) including a respective thin portion (214')

and a respective thick portion (214"), which surrounds the thin portion (214'); forming the main anode region (8) underneath the thin portion (214') of the first preliminary dielectric region (214), the main anode region (8) may include a respective inner portion and a respective peripheral portion; and subsequently on the first preliminary dielectric region (214), forming a second preliminary dielectric region (216); selectively removing a portion of the second preliminary dielectric region (216) and an underlying part of the thin portion (214') of the first preliminary dielectric region (214), so as to form a first opening (15) which faces the inner portion of the main anode region (8), the residual portions of the first and the second preliminary dielectric regions (214, 216) respectively forming a field oxide region (14), which extends on the peripheral portion of the anode region (8,10), and a front dielectric region (16). The forming the barrier region (17) may include forming the barrier region (17) inside the first opening (15), in direct contact with the inner portion of the main anode region (8); and forming the metallization region (118) may include forming the metallization region (118) on the front dielectric region (16) and inside the first opening (15).

The manufacturing process may further include, on the semiconductor body (2), forming a first preliminary dielectric region (214) including a respective thin portion (214') and a respective thick portion (214"), which surrounds the thin portion (214'); forming the main anode region (8) underneath the thin portion (214') of the first preliminary dielectric region (214), the main anode region (8) comprising a respective inner portion and a respective peripheral portion; and subsequently, on the first preliminary dielectric region (214), forming a second preliminary dielectric region (216); selectively removing a portion of the second preliminary dielectric region (216) and an underlying part of the thin portion (214') of the first preliminary dielectric region (214), so as to form a first opening (15) which faces the inner portion of the main anode region (8), the residual portions of the first and the second preliminary dielectric regions (214, 216) respectively forming a field oxide region (14), which extends on the peripheral portion of the main anode region (8), and a front dielectric region (16); through the first opening (15), forming an enriched anode region (10), which extends in the inner portion of the main anode region (8) and has a higher doping level than the doping level of the main anode region (8). Forming the barrier region (17) may include forming the barrier region (17) inside the first opening (15), in direct contact with the enriched anode region (10). Forming the metallization region (118) comprises forming the metallization region (118) on the front dielectric region (16) and inside the first opening (15).

Forming the barrier region (17) may include forming a conductive layer (217) of cobalt including a first portion (217'), arranged inside the first opening (15), and a second portion (217"), arranged on the front dielectric region (16); performing a first thermal process to transform the cobalt of the first portion (217') of the conductive layer (217) into cobalt silicide; and subsequently selectively removing the second portion (217") of the conductive layer (217); and subsequently performing a second thermal process to transform the cobalt silicide of the first portion (217') of the conductive layer (217) into cobalt disilicide.

The manufacturing process may further include, on the semiconductor body (2), forming a first preliminary dielectric region (214) including a respective thin portion (214') and a respective thick portion (214"), which surrounds the thin portion (214'); forming the main anode region (8) underneath the thin portion (214') of the first preliminary dielectric region (214), said main anode region (8) may include a respective inner portion and a peripheral portion; selectively removing the thin portion (214') of the first preliminary dielectric region (214), so as to form a first opening (115) which faces the inner portion and the peripheral portion of the main anode region (8,10), the remaining portion of the first preliminary dielectric region (214) forming a field oxide region (114). Forming the barrier region (117) may include forming the barrier region (117) inside the first opening (115), in direct contact with the inner portion and the peripheral portion of the main anode region (8); said manufacturing process may further include forming a second preliminary dielectric region (216) on the barrier region (117) and on the field oxide region (114); and subsequently selectively removing a portion of the second preliminary dielectric region (216), so as to form a second opening (125) which faces a portion of the barrier region (117) that overlies the inner portion of the main anode region (8), the remaining portion of the second preliminary dielectric region (216) forming a front dielectric region (116); and subsequently forming the metallization region (118) on the front dielectric region (116) and on said portion of the barrier region (117) that overlies the inner portion of the anode region (8).

The manufacturing process may further include, on the semiconductor body (2), forming a first preliminary dielectric region (214) including a respective thin portion (214') and a respective thick portion (214"), which surrounds the thin portion (214'); forming the main anode region (8) underneath the thin portion (214') of the first preliminary dielectric region (214), said main anode region (8) comprising a respective inner portion and a peripheral portion; selectively removing the thin portion (214') of the first preliminary dielectric region (214), so as to form a first opening (115) which faces the inner portion and the peripheral portion of the main anode region (8), the remaining portion of the first preliminary dielectric region (214) forming a field oxide region (114). Forming the barrier region (117) main include forming the barrier region (117) inside the first opening (115), in direct contact with the inner portion and the peripheral portion of the main anode region (8). The manufacturing process may further include forming a second preliminary dielectric region (216) on the barrier region (117) and on the field oxide region (114); and subsequently selectively removing a portion of the second preliminary dielectric region (216), so as to form a second opening (125) which faces a portion of the barrier region (117) that overlies the inner portion of the main anode region (8), the remaining portion of the second preliminary dielectric region (216) forming a front dielectric region (116); and subsequently through the second opening (125), forming an enriched anode region (10), which extends in the inner portion of the main anode region (8) and has a higher doping level than the doping level of the main anode region (8); and subsequently forming the metallization region (118) on the front dielectric region (116) and on said portion of the barrier region (117) that overlies the inner portion of the main anode region (8).

Forming the barrier region (17) may include forming a conductive layer (217) of cobalt including a first portion (217'), arranged inside the first opening (115), and a second portion (217"), arranged on the field oxide region (114); performing a first thermal process to transform the cobalt of the first portion (217') of the conductive layer (217) into cobalt silicide; and subsequently selectively removing the second portion (217") of the conductive layer (217); and subsequently performing a second thermal process to transform the cobalt silicide of the first portion (217') of the conductive layer (217) into cobalt disilicide.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diode comprising:
a semiconductor body;
a cathode region in the semiconductor body and delimited by a front surface of the semiconductor body, the cathode region having a first conductivity type;
an anode region in the semiconductor body and extending into the cathode region from the front surface, the anode region having a second conductivity type, the anode region including an inner portion and a peripheral portion;
a field oxide region on the semiconductor body and on the peripheral portion of the anode region;
a front dielectric region on the field oxide region;
a first opening in the field oxide region and the front dielectric region, the first opening overlying the inner portion of the anode region;
a barrier region including cobalt disilicide, the barrier region extending in the first opening, in direct contact with the inner portion of the anode region; and
a metallization region including aluminum, arranged on the barrier region.

2. The diode according to claim 1, wherein
the semiconductor body includes silicon,
the second conductivity type is a P-type conductivity, and
the anode region has a peak doping level between $1*10^{14}$ cm$^{-3}$ and $1*10^{16}$ cm$^{-3}$.

3. The diode according to claim 1, wherein the metallization region extends on the front dielectric region and in the first opening.

4. The diode according to claim 1, wherein the semiconductor body includes an enriched anode region having the second conductivity type, and
the enriched anode region extends into the inner portion of the anode region, and has a doping level higher than a doping level of the anode region.

5. The diode according to claim 1, wherein
the barrier region extends on the inner portion and on the peripheral portion of the anode region,
the front dielectric region is on a portion of the barrier region that is on the peripheral portion of the anode region, and
the metallization region extends on the front dielectric region and on the portion of the barrier region that is on the inner portion of the anode region.

6. The diode according to claim 1, wherein
the anode region includes an enriched anode region extending into the inner portion,
the enriched anode region has a doping level that is greater than a doping level of the inner portion and the peripheral portion, and
the barrier region extends inside the first opening, on the enriched anode region.

7. A device, comprising:

a semiconductor substrate;

a cathode region in the semiconductor substrate;

an anode region in the cathode region;

a barrier region on the anode region;

a first dielectric layer on the semiconductor substrate, the first dielectric layer having a first opening overlying the barrier region;

a second dielectric layer on the first dielectric layer, the second dielectric layer having a second opening overlying the first opening;

a first metallization structure on a first side of the semiconductor substrate; and a second metallization structure on a second side, opposite to the first side, of the semiconductor substrate, on the second dielectric layer, and in the second opening, the second metallization structure including aluminum.

8. The device of claim 7, wherein a portion of the second dielectric layer is spaced from the anode region by a portion of the barrier region.

9. The device of claim 7, further comprising:

an enriched anode region in the anode region and underlying the barrier region.

10. A diode comprising:

a semiconductor body;

a cathode region in the semiconductor body and delimited by a front surface of the semiconductor body, the cathode region having a first conductivity type;

an anode region in the semiconductor body and extending into the cathode region from the front surface, the anode region having a second conductivity type, the anode region including an inner portion, a peripheral portion, and an enriched anode region extending into the inner portion, the enriched anode region having a doping level that is greater than a doping level of the inner portion and the peripheral portion;

a field oxide region on the peripheral portion;

a front dielectric region on the field oxide region; and a first opening in the field oxide region and the front dielectric region, and overlying the enriched anode region, and a barrier region including cobalt disilicide, extending inside the first opening, on the enriched anode region; and a metallization region including aluminum, arranged on the barrier region.

11. The diode according to claim 10, wherein the semiconductor body includes silicon, the second conductivity type is a P-type conductivity, and the anode region has a peak doping level between $1*10^{14}$ $cm^{-3}$ and $1*10^{16}$ $cm^{-3}$.

12. The diode according to claim 10, wherein the metallization region extends on the front dielectric region and in the first opening.

13. The diode according to claim 10, wherein the barrier region extends on the inner portion and on the peripheral portion of the anode region, the front dielectric region is on a portion of the barrier region that is on the peripheral portion of the anode region, and the metallization region extends on the front dielectric region and on the portion of the barrier region that is on the inner portion of the anode region.

* * * * *